(12) United States Patent
Craddock et al.

(10) Patent No.: US 9,998,089 B2
(45) Date of Patent: Jun. 12, 2018

(54) RESONATOR DEVICE

(71) Applicant: GENERAL ELECTRIC COMPANY, Schenectady, NY (US)

(72) Inventors: Russell Craddock, Leicsetershire (GB); Roger Jones, Leicestershire (GB); Li Zhao, Leicestershire (GB); Muhammad Irshad, Leicestershire (GB)

(73) Assignee: General Electric Company, Schenectady, NY (US)

( * ) Notice: Subject to any disclaimer, the term of this patent is extended or adjusted under 35 U.S.C. 154(b) by 242 days.

(21) Appl. No.: 14/650,658

(22) PCT Filed: Dec. 13, 2013

(86) PCT No.: PCT/US2013/075004
§ 371 (c)(1),
(2) Date: Jun. 9, 2015

(87) PCT Pub. No.: WO2014/093817
PCT Pub. Date: Jun. 19, 2014

(65) Prior Publication Data
US 2016/0191011 A1 Jun. 30, 2016

(51) Int. Cl.
*G01L 1/10* (2006.01)
*H03H 9/02* (2006.01)
(Continued)

(52) U.S. Cl.
CPC ........... *H03H 9/02244* (2013.01); *G01K 7/32* (2013.01); *G01L 1/103* (2013.01); *G01L 9/002* (2013.01);
(Continued)

(58) Field of Classification Search
USPC ....................................................... 73/862.59
See application file for complete search history.

(56) References Cited

U.S. PATENT DOCUMENTS

| 4,329,058 A | 5/1982 | James et al. |
| 4,503,715 A | 3/1985 | Greenwood |

(Continued)

FOREIGN PATENT DOCUMENTS

| EP | 0232610 | 8/1987 |
| EP | 0244086 A2 | 11/1987 |

(Continued)

OTHER PUBLICATIONS

Office Action issued in connection with corresponding GB Application No. 1222630.4 dated Jan. 21, 2016.

(Continued)

*Primary Examiner* — Clayton E Laballe
*Assistant Examiner* — Warren K Fenwick
(74) *Attorney, Agent, or Firm* — GE Global Patent Operation

(57) ABSTRACT

A resonator device 10 is disclosed. The resonator device may be used in a transducer or a sensor such as a pressure, force or acceleration sensor. The resonator device comprises a resonator 20 provided on a diaphragm 30. A cap 40 is provided which may be fusion bonded to the diaphragm 30 to enclose the resonator 20 and form a hermetically sealed package 10. The resonator device is excited by applying electromagnetic stimulation, such as infra-red or optical stimulation, which may be from a laser via a fiber 50. The resonator device may be interrogated by applying an electromagnetic signal into the optical cavity formed between the resonator 20 and the inside surface of the cap 40 to derive a frequency change of the resonator. As the resonator device incorporates a hermetically sealed package and is stimulated by electromagnetic radiation, it is robust and able to operate in harsh environments.

20 Claims, 4 Drawing Sheets

(51) Int. Cl.
*G01L 9/00* (2006.01)
*G01L 19/00* (2006.01)
*G01L 19/04* (2006.01)
*G01K 7/32* (2006.01)
*G01P 15/02* (2013.01)
*H03H 3/007* (2006.01)
*H03H 3/02* (2006.01)

(52) U.S. Cl.
CPC ........ *G01L 9/0077* (2013.01); *G01L 19/0092* (2013.01); *G01L 19/04* (2013.01); *G01P 15/02* (2013.01); *H03H 3/0072* (2013.01); *H03H 3/02* (2013.01)

(56) References Cited

U.S. PATENT DOCUMENTS

| | | | |
|---|---|---|---|
| 4,567,451 A * | 1/1986 | Greenwood | G01B 11/16 250/205 |
| 4,678,909 A | 7/1987 | Jackson et al. | |
| 4,813,271 A | 3/1989 | Greenwood | |
| 4,942,767 A | 7/1990 | Haritonidis et al. | |
| 5,090,254 A | 2/1992 | Guckel et al. | |
| 5,101,664 A | 4/1992 | Hockaday et al. | |
| 5,128,537 A | 7/1992 | Haelg | |
| 5,265,479 A | 11/1993 | Cook et al. | |
| 5,442,963 A | 8/1995 | Largeau | |
| 5,657,405 A | 8/1997 | Fujiwara | |
| 5,747,705 A | 5/1998 | Herb et al. | |
| 6,281,976 B1 | 8/2001 | Taylor et al. | |
| 6,820,489 B2 | 11/2004 | Fernald et al. | |
| 7,164,479 B2 | 1/2007 | Johansen et al. | |
| 7,499,604 B1 * | 3/2009 | Burns | G01L 9/002 385/12 |
| 7,743,661 B2 | 6/2010 | Berthold et al. | |
| 7,782,465 B2 | 8/2010 | Gibler et al. | |
| 7,787,128 B2 | 8/2010 | Lopushansky | |
| 2003/0117630 A1 | 6/2003 | Youngner et al. | |
| 2003/0137296 A1 | 7/2003 | Youngner | |
| 2004/0231409 A1 * | 11/2004 | Lelong-Feneyrou | G01L 9/002 73/152.51 |
| 2005/0229711 A1 | 10/2005 | Ohms et al. | |
| 2005/0237538 A1 | 10/2005 | Belleville | |
| 2005/0253283 A1 | 11/2005 | DCamp et al. | |
| 2007/0052046 A1 | 3/2007 | Chu et al. | |
| 2007/0074578 A1 | 4/2007 | Kanakasabapathi et al. | |
| 2007/0236213 A1 | 10/2007 | Paden et al. | |
| 2009/0309203 A1 | 12/2009 | Seppala et al. | |
| 2010/0189444 A1 | 7/2010 | Vernooy et al. | |

FOREIGN PATENT DOCUMENTS

| | | |
|---|---|---|
| EP | 0266974 A2 | 5/1988 |
| EP | 0331671 A1 | 9/1989 |
| EP | 0571107 A1 | 11/1993 |
| EP | 0649009 A2 | 4/1995 |
| EP | 0667548 | 8/1995 |
| GB | 2121953 A | 1/1984 |
| GB | 2146120 A | 4/1985 |
| GB | 2162314 A | 1/1986 |
| GB | 2189600 A | 10/1987 |
| WO | 89/00677 | 1/1989 |
| WO | 2012140846 A1 | 10/2012 |

OTHER PUBLICATIONS

Barth, "Silicon fusion bonding for fabrication of sensors, actuators and microstructures", vol. No. 23, Issue No. 1, pp. 919-926, Apr. 1990.

Corman, "Low-pressure-encapsulated resonant structures with integrated electrodes for electrostatic excitation and capacitive detection", Sensors and actuators. A, Physical, vol. No. 66, Issue No. 1/3, pp. 160-166, 1998.

Examination Report issued in connection with corresponding GB Application No. 1222630.4 dated Jun. 8, 2016.

Examination Report issued in connection with corresponding GB Application No. GB1222630.4 dated Jul. 23, 2015.

International Search Report and Written Opinion dated Nov. 4, 2014 which was issued in connection with PCT Patent Application No. PCT/US13/75004 with was filed on Dec. 13, 2013.

Great Britain Search Report and Written Opinion dated Apr. 10, 2014 which was issued in connection with GB Patent Application No. 1222630.4 which was filed on Dec. 14, 2012.

* cited by examiner

RESONATOR DEVICE

This invention relates to a resonator device, in particular to a resonator device which may be used in a transducer or a sensor.

Resonator devices, especially so-called MEMS (Micro Electro-Mechanical Systems) resonator devices provide compact, cost-effective and precise components which may be used in various applications such as sensors and actuators. A mechanically resonating device typically comprises one or more elongate members supported by mesas which are provided on a flexible diaphragm. 10 In use, the one or more elongate members oscillate with the frequency of oscillation being dependent upon forces acting on the diaphragm which are transferred to the one or more elongate members via the mesas. Such a resonator device is shown for example in GB 2 162 314.

Oscillation of the elongate members is maintained by supplying energy, for example via an adjacent alternating electric or magnetic field. However, in many applications such as downhole in oil and gas fields, in aerospace applications and in power generation, conditions are encountered which are detrimental to the device. For example, at high temperatures of several hundred degrees, metal tracks degrade and a piezo resistive function will suffer from 20 leakage which reduces accuracy or renders the device inoperative.

U.S. Pat. No. 4,813,271 discloses a mechanically resonant sensor device in which the system is oscillated by applying high intensity infra-red pulses from a laser to a coupling linking two adjacent elongate members. Each pulse causes a momentary thermal expansion of the 25 coupling and thus provides oscillation to the elongate members by the photothermal effect. However, an optical fibre or connecting stub supplying the pulses to the internal resonating device has to be provided through the device package which can lead to leakage to or from the controlled environment or vacuum conditions within the package. This can lead to reduced accuracy and damage to the device. Furthermore, assembly of the package becomes 30 more complicated and expensive because of having to provide the optical fibre or stub in the package wall and then evacuate the package to provide vacuum or controlled pressure conditions inside.

Embodiments of this invention provide a resonator device which is able to withstand harsh environmental conditions such as high temperatures which may for example be encountered downhole or in aerospace and power generation applications whilst still providing a robust resonator package that may be assembled without undue complication and associated expense.

According to a first aspect, there is provided a resonator device for a transducer, the resonator device comprising a resonator provided on a diaphragm with a cap enclosing the resonator 10 and forming a hermetically sealed package, wherein the resonator is arranged to be excited by applying electromagnetic stimulation.

Providing a hermetically sealed package overcomes the problems of possible leakage caused by having to provide an optical fibre or connecting stub through the package wall as in the 15 prior art whilst exciting the resonator by applying electromagnetic stimulation, such as by a laser, enables embodiments to operate in harsh environmental conditions such as high temperatures.

Electromagnetic stimulation may be applied to the resonator from outside the hermetically sealed package, for example by a laser or optical fibre. The electromagnetic stimulation may comprise applying electromagnetic pulses to the resonator, such as infra red or optical pulses.

At least a portion of the cap may be transparent to the electromagnetic radiation arranged to travel through the cap, such as infra red or optical radiation. This may be achieved by at least a portion of the cap being undoped or being low doped. This ensures that very little power is absorbed or reflected as the electromagnetic radiation travels through the cap.

An optical cavity may be formed between the inside surface of the cap and the resonator and the resonator device may be arranged to be interrogated by applying an electromagnetic signal into the optical cavity to derive a frequency change of the resonator. The stimulating electromagnetic radiation and the interrogating electromagnetic signal may both be applied through the same fibre.

According to a second aspect, there is provided a method of fabricating a resonator device. The 5 method comprises providing a diaphragm wafer, a resonator wafer and a cap wafer; bonding the wafers together to form a hermetically sealed package with the resonator enclosed by the diaphragm and the cap and arranging to apply electromagnetic radiation to the sealed package.

Embodiments of the present invention will now be described, by way of example only, with
reference to the accompanying drawings, in which.

Figure 1:
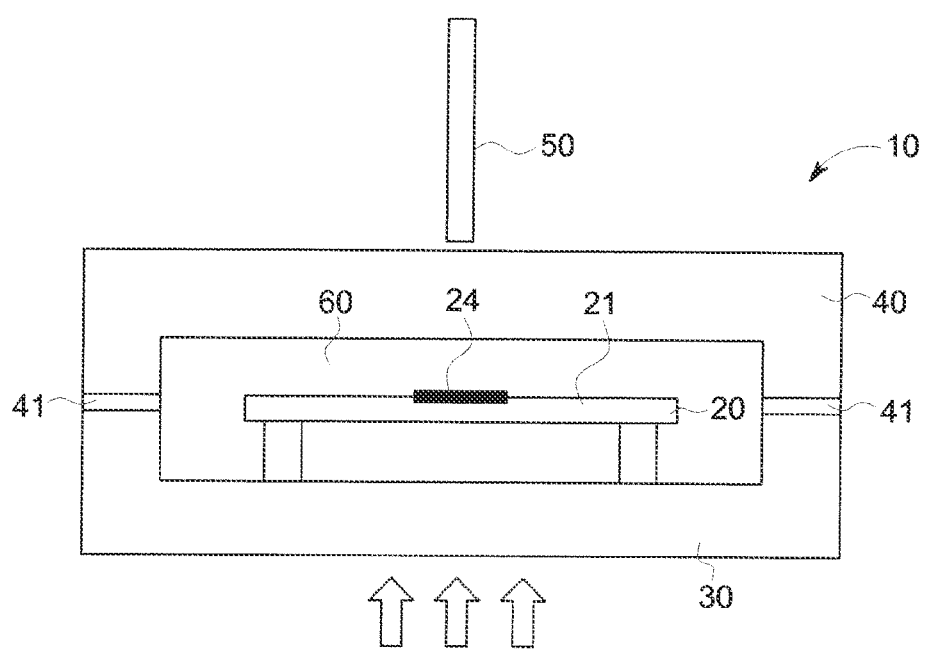
FIG. 1 shows a resonator device of an example of the present invention.

FIG. 1 shows a resonator device 10 of an example of the present invention. The resonator device may be used in a transducer for various applications, such as to measure pressure, force, acceleration, the presence of a fluid etc. The resonator device comprises a resonator 20 provided on a diaphragm 30. The resonator 20 is enclosed by a cap 40 provided over it forming a hermetically sealed package. In this example the cap 40 is bonded 41 to the diaphragm 30, such as by silicon fusion bonding, with a vacuum environment provided within the sealed package. The resonator 20 within the sealed package is excited or stimulated by applying electromagnetic radiation, such as infra-red or visible light, from outside the sealed package, in this example from a fibre 50, onto the resonator 20.

As well as being excited by electromagnetic radiation, the resonator device 10 may be 5 interrogated by electromagnetic radiation as well. The resonator 20 and the inside surface of the cap 40 may form an optical cavity 60, such as a Fabry-Perot cavity between them. A force, such as pressure acting on the outside surface of the diaphragm 30, changes the stiffness of the resonator 20 causing its resonant frequency to change. The resonant frequency may be determined, for example by analysing the interference fringe pattern of an 10 interrogating electromagnetic signal applied to the optical cavity, such that the pressure acting on the outside surface of the diaphragm may be derived. The resonator device 10 may be stimulated and interrogated using only one fibre 50. Different wave lengths of electromagnetic radiation may be used to stimulate and interrogate respectively the device 10 using the same fibre 50. Alternatively or additionally, stimulation and interrogation may be 15 performed at different times.

The resonator device may be made from silicon, such as single crystal silicon providing the advantages of no creep and no plasticity. MEMS technology may be used for fabrication.

The resonator package 10 may be made by silicon fusion bonding the diaphragm 30, resonator 20 and cap 40 together to create a hermetic seal of the resonator cavity 60 and to simultaneously produce vacuum conditions inside the package 10 without requiring subsequent processing steps to evacuate the package. As the electromagnetic stimulation 50 is applied extrinsically, the package does not need to be penetrated so that the evacuated 25 optical cavity 60 within the package is not compromised. The transducer of this example is especially suitable for use in harsh and high temperature environments such as downhole in oil and gas operations, in geothermal applications and aero-engines for example because of its robustness due to the use of a hermetically sealed package.

Figure 2:
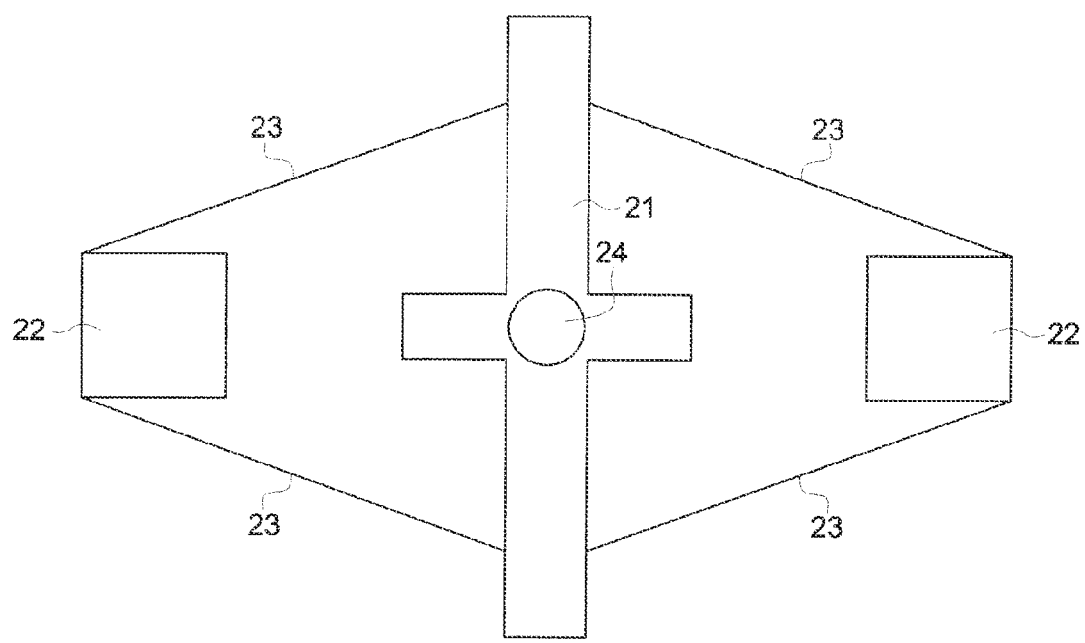
FIG. 2 shows an example of an arrangement of the resonator.

FIG. 2 is a top view of an example of a resonator 20. In this example a resonator beam 21 is supported by two mesas 22 that are standing on the diaphragm 30. The resonator beam 21 shown in FIG. 2 is attached to the mesas 22 via supports 23. However, any suitable resonator arrangement may be used, such as the one shown in side view of FIG. 1 with the resonator beam 21 directly supported by the mesas 22.

When a force 5 such as pressure, acceleration etc is applied to the external surface of the diaphragm 30, a corresponding deflection is generated in the diaphragm 30. The deflection is then transferred into a stretching force in the resonator beam 21 through the mesas 22. The resonator beam 21 is thus stiffened and the resonant frequency of the resonator beam changes corresponding to the pressure applied to the diaphragm 30.

The resonator 20 is excited by applying electromagnetic stimulation via the fibre 50 to excite vertical vibrations by means of the photothermal effect. In this example a target pad 24 with a surface arranged to absorb the electromagnetic stimulation is provided on the resonator beam 21, preferably in the centre. The target 24 may be coated with an electromagnetic 15 radiation absorbing layer to enable its temperature to be changed more easily by the applied electromagnetic radiation. The optical target may comprise a shallow, opaque region such as by being heavily Boron doped to absorb more power from the electromagnetic stimulation which helps to reduce the power budget from the laser source. The target pad 24 is heated up by the electromagnetic stimulation and performs a deformation. When the electromagnetic 20 stimulation is turned off, the heat is then dissipated and the resonator beam 21 returns to its previous state. By applying appropriate modulation pulses depending upon the particular circumstances, eg power of stimulating electromagnetic radiation, size of resonator beam 21, size of target pad 24 etc the resonator can be excited to an appropriate resonating mode.

The target pad 24 may be relatively large, for example twice, five times or ten times larger than the fibre diameter. This enables the electromagnetic source 50 to be aligned easily with the target 24 such that active alignment is not required and provides robustness to protect against subsequent relative movement.

The interrogating electromagnetic radiation applied from outside the hermetically sealed device 10 from the fibre 50 is partially reflected back from the internal surface of the cap 40 and partially dynamically modulated by the resonator beam 21 and then also reflected back to the fibre 50. Pressure applied to the external surface of the diaphragm 30 can then be derived by measuring the characteristics of the phase interference fringes from the reflected interrogating electromagnetic radiation through the optical cavity 60.

The resonator 20 is arranged to maintain lateral dynamic balance and mass balance in a vertical direction, in this example by having a symmetrical structure. Alternatively or additionally this may be achieved by the resonator beam 21 being driven in the 3rd mode.

The deflection of 10 the resonator determines the resolution of the interference fringes. The resonator of this example is designed to achieve a deflection of about ¼ of the wavelength of the interrogating electromagnetic radiation (about 400 nm for a 1550 nm laser) to provide relatively high level modulation without introducing severe straining stiffening thus achieving low non-linearity.

The cap 40, or at least the portion of the cap 40 through which electromagnetic radiation is passed, is transparent to the electromagnetic radiation. This may for example be achieved by using an undoped or relatively low doped cap 40 or portion of the cap 40 through which the electromagnetic radiation is arranged to pass. This ensures that little or no power is absorbed 20 or reflected while the electromagnetic radiation is travelling through the cap 40.

The resonator device may be provided with an integrated temperature sensor. Since the thickness of the cap 40 varies with temperature, by measuring the thermal expansion of the cap using the electromagnetic stimulation or interrogation signal, the temperature of the package may be determined, for example by using previous calibration using a look-up table, algorithm etc. A suitable cap thickness may be selected such that its "optical thickness" can be measured as a temperature signal. A temperature measurement enables resonator frequency changes to be compensated for temperature for enhanced accuracy. The device may also be used as a temperature sensor or multivariable sensor.

Figure 3:
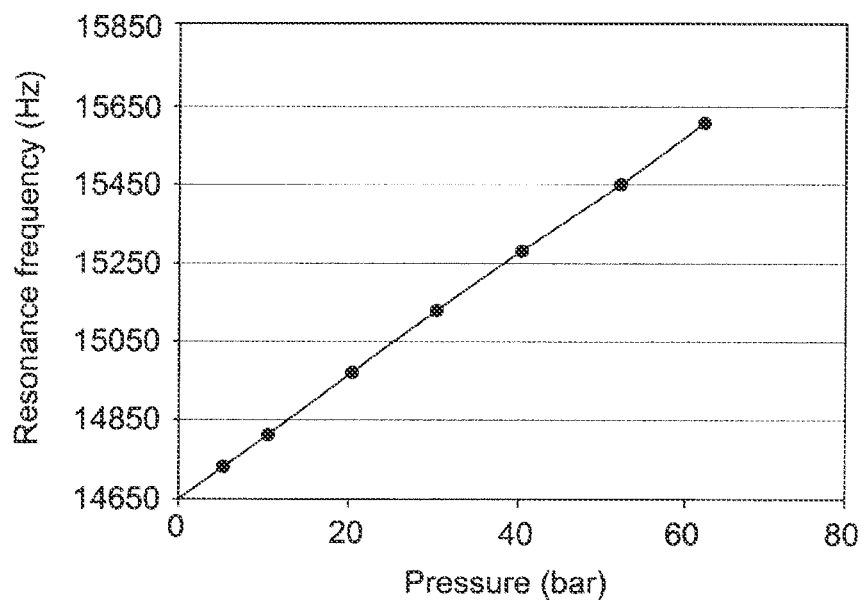
FIG. 3 shows experimental results of variation in resonant frequency with pressure for an example of the present invention and FIG. 4 is a flow diagram of a method of fabricating a resonator device of an example of the present invention.

FIG. 3 shows the clear correspondence between applied pressure and resultant resonant frequency of the package illustrating the precision of results achieved from a resonator device which is also very robust and suitable for use in harsh environments, such as downhole, in aero-engines etc. Similar results are obtained when using the resonator device to measure other characteristics such as force, acceleration, fluid presence etc.

Figure 4:
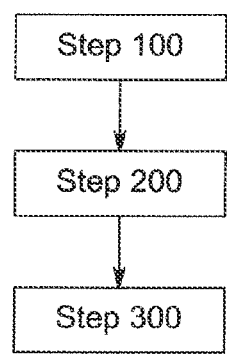

FIG. 4 is a flow diagram of a method for fabricating a resonator device 10. In step 100, a diaphragm wafer 30, a resonator wafer 20 and a cap wafer 40 are provided. In step 200 they are bonded together, preferably by silicon fusion bonding, to form a hermetically sealed 10 package 10 with the resonator 20 enclosed by the diaphragm 30 and cap 40. In step 300 electromagnetic radiation is arranged to be applied extrinsically to the sealed package 10 to stimulate and interrogate the resonator 20, for example via a fibre 50 connected to an appropriate source of electromagnetic radiation such as a laser.

Many variations may be made to the examples described above without departing from the present invention. For example, the resonator device 10 may be used in any appropriate transducer device, such as to measure pressure, force, acceleration, the presence of a fluid etc.

The invention claimed is:

1. A resonator device for a transducer, the resonator device comprising:
   a resonator provided on a diaphragm with a cap enclosing the resonator and forming an optical cavity between inside surface of the cap and the resonator, to form a hermetically sealed package, wherein the resonator is arranged to be excited by applying electromagnetic stimulation, wherein the resonator is provided with a target to receive the electromagnetic stimulation, and wherein a diameter of the target is larger than a diameter of a fibre which is used to apply the electromagnetic stimulation.

2. The resonator device of claim 1, wherein the electromagnetic stimulation is applied from outside the hermetically sealed package.

3. The resonator device of claim 1, wherein at least a portion of the cap is transparent to electromagnetic radiation from the electromagnetic stimulation.

4. The resonator device of claim 1, wherein the resonator device is arranged to be interrogated by applying an electromagnetic signal into the optical cavity, formed between the inside surface of the cap and the resonator, to derive a frequency change of the resonator.

5. The resonator device of claim 4, wherein the electromagnetic stimulation of the resonator and the electromagnetic signal to interrogate the resonator device are both applied through a same fibre.

6. The resonator device of claim 4, wherein the electromagnetic stimulation and interrogating electromagnetic signal are of different wavelengths.

7. The resonator device of claim 1, wherein each of the resonator, the diaphragm, and the cap are formed from silicon wafers that are fusion bonded together to create an evacuated hermetically sealed package.

8. The resonator device of claim 1, wherein the resonator device is arranged to measure thermal expansion or thermal contraction of a thickness of the cap to determine temperature.

9. The resonator device of claim 8, wherein the measured thermal expansion or thermal contraction of the thickness of the cap is used to compensate for thermally induced resonator frequency changes.

10. The resonator device of claim 1, wherein the diameter of the target is at least ten times the diameter of the fibre.

11. The resonator device of claim 10, wherein the target is coated with a light absorbing layer.

12. A pressure transducer including the resonator device according to claim 1.

13. An acceleration sensor including the resonator device according to claim 1.

14. A force sensor including the resonator device according to claim 1.

15. A method of fabricating a resonator device, the method comprising:

providing wafers comprising a diaphragm wafer, a resonator wafer and a cap wafer;

forming an optical cavity between an inside surface of the cap wafer and the resonator wafer;

bonding the wafers together to form a hermetically sealed package with the resonator wafer enclosed by the diaphragm wafer and the cap wafer;

arranging the hermetically sealed package to apply an electromagnetic radiation to the hermetically sealed package; and positioning a target on a surface of the resonator to receive the electromagnetic radiation, wherein a diameter of the target is larger than a diameter of a fibre which is used to apply the electromagnetic radiation.

16. The method of claim 15, wherein the electromagnetic radiation is applied extrinsically to the hermetically sealed package.

17. A resonator device for a transducer, the resonator device comprising:

a resonator positioned on a diaphragm, and a cap enclosing the resonator to form an optical cavity between an inside surface of the cap and the resonator, wherein the resonator is arranged to be excited by applying an electromagnetic radiation, and wherein an electromagnetic signal, having a different wavelength than the electromagnetic radiation, is applied into the optical cavity to derive a frequency change of the resonator.

18. The resonator device of claim 17, wherein the electromagnetic radiation of the resonator and the electromagnetic signal applied to the optical cavity of the resonator device are both applied through a same fibre.

19. The resonator device of claim 17, wherein the resonator device includes a hermetically sealed package defined by the cap which encloses the resonator and the diaphragm.

20. The resonator of claim 17, wherein the resonator device is arranged to measure thermal expansion or thermal contraction of a thickness of the cap to determine a temperature.

* * * * *